(12) United States Patent
Hsieh

(10) Patent No.: US 11,347,280 B1
(45) Date of Patent: May 31, 2022

(54) FASTENER FOR USE IN ELECTRONIC DEVICE

(71) Applicant: KANG YANG HARDWARE ENTERPRISES CO., LTD., New Taipei (TW)

(72) Inventor: Shu-Li Hsieh, New Taipei (TW)

(73) Assignee: KANG YANG HARDWARE ENTERPRISES CO., LTD., New Taipei (TW)

( * ) Notice: Subject to any disclaimer, the term of this patent is extended or adjusted under 35 U.S.C. 154(b) by 0 days.

(21) Appl. No.: 17/231,422

(22) Filed: Apr. 15, 2021

(30) Foreign Application Priority Data

Mar. 11, 2021 (TW) .................................. 110108781

(51) Int. Cl.
| G06F 1/16 | (2006.01) |
| H05K 5/00 | (2006.01) |
| H05K 7/00 | (2006.01) |
| G06F 1/18 | (2006.01) |
| H05K 7/14 | (2006.01) |

(52) U.S. Cl.
CPC .............. *G06F 1/185* (2013.01); *G06F 1/186* (2013.01); *H05K 7/1405* (2013.01); *H05K 7/1417* (2013.01)

(58) Field of Classification Search
CPC .. H05K 7/1405; H05K 7/1417; H05K 7/1407; H05K 7/1408; H05K 7/1409; H05K 7/1402; G06F 1/185; G06F 1/186
See application file for complete search history.

(56) References Cited

U.S. PATENT DOCUMENTS

| 4,526,429 | A | * | 7/1985 | Kirkman | ................ | H01R 12/58 439/825 |
| 5,073,119 | A | * | 12/1991 | Soes | .................... | H01R 12/585 439/82 |
| 7,072,179 | B1 | * | 7/2006 | Curran | ...................... | G06F 1/20 165/104.32 |
| 2007/0236888 | A1 | * | 10/2007 | Eckberg | .............. | H01L 23/4006 361/704 |
| 2009/0168360 | A1 | * | 7/2009 | Negrut | ................ | H01L 23/4006 361/688 |
| 2013/0050954 | A1 | * | 2/2013 | Albrecht, III | ........ | H05K 1/0203 361/720 |
| 2014/0204536 | A1 | * | 7/2014 | Jones | ................. | H05K 7/20409 361/728 |

\* cited by examiner

*Primary Examiner* — Anthony M Haughton
(74) *Attorney, Agent, or Firm* — Guice Patents PLLC

(57) ABSTRACT

A fastener for use in electronic device includes: a positioning member, having a base, wherein a connecting ring is disposed above the base, a rail slot having two ends respectively formed with a start blocking edge and a stop blocking edge is disposed on a top surface of the connecting ring, and a buckle slot is formed between the base and the connecting ring; and a rotating member, having a shaft column, wherein a block piece is radially formed on a top end of the shaft column, an annular supporting platform is radially formed at a bottom end thereof, at least three wing pieces are axially and downwardly extended from a circumference of the supporting platform, wherein at least two of the wing pieces respectively have a buckle hook, and the other wing piece is radially extended with a position limiting sheet.

11 Claims, 16 Drawing Sheets

A-A

B-B

C-C

E-E

FASTENER FOR USE IN ELECTRONIC DEVICE

BACKGROUND OF THE INVENTION

Field of the Invention

The present invention relates to a fastener, especially to a fastener for use in electronic device, for example a M.2 solid-state drive, a Wi-Fi wireless network card, a 3G network card or an electric circuit board.

Description of the Related Art

A conventional electronic device, for example a M.2 solid-state drive, has one end provided with an insertion part having a plurality of contact terminals, and has another end provided with a positioning recess formed in a semicircle shape and used for positioning. The insertion part is inserted in a plate member, for example a connector preset on a printed circuit board, and the positioning recess at the another end is disposed and clamped in a fastener; the fastener includes a positioning member inserted on the plate member, the positioning member has a columnar body axially formed with an insertion hole, and a supporting concave part allowing the positioning recess of the electronic device to be received is disposed on a top surface of the columnar body; and a clamping member having a clamping sheet, a positioning pin inserted in the insertion hole is axially protruded on a top surface of the clamping sheet, so that the clamping sheet is able to seal the supporting concave part, and the clamping sheet and the supporting concave part can jointly clamp the positioning recess, thereby enabling the electronic device to be fastened on the plate member and establish an electric connection with the connector.

The fastening pin has a positioning buckle slot, and the insertion hole has a positioning convex ring arranged at a location corresponding to the positioning buckle slot. When the fastening pin is inserted in the insertion hole, an interference is generated through the positioning buckle slot and the positioning convex ring, thereby achieving a fastening effect to buckle the clamping sheet with the positioning member. However, after the buckle structure has been repeatedly inserted and removed, a wearing situation may happen to the positioning buckle slot and the positioning convex ring, thus a retaining and fastening force for the above two components would be lowered, or there would be no interference after being operated for a period of time; accordingly, the disadvantage of losing the retaining and fastening force shall be improved.

SUMMARY OF THE INVENTION

One primary objective of the present invention is to provide a fastener for use in electronic device, in which a positioning member allows a rotating member to be rotated and positioned, so that after a block piece and a supporting platform of the rotating member are rotated so as to be positioned, the block piece is able to form a locked status to an electronic device, for example a M.2 solid-state drive, a Wi-Fi wireless network card, a 3G network card or an electric circuit board.

For achieving said objective, one technical solution provided by the present invention is to provide a fastener for use in electronic device, which includes: a positioning member, having a base, wherein a connecting ring is disposed above the base and spaced with an interval relative to the base, a rail slot is disposed on a top surface of the connecting ring, two ends of the rail slot are respectively formed with a start blocking edge and a stop blocking edge, and a buckle slot is formed between the base and the connecting ring; and a fastening structure capable of being fastened on a plate member is disposed on a bottom surface of the base; and a rotating member, having a shaft column arranged in an axial direction of the rotating member, wherein a block piece is radially formed on a top end of the shaft column, an annular supporting platform allowing an electronic device to be disposed is radially formed at a bottom end of the shaft column, so that a gap is formed between the block piece and the supporting platform, at least three wing pieces are axially and downwardly extended from a circumference of the supporting platform, wherein at least two of the wing pieces respectively have a buckle hook buckled with the buckle slot, and the other wing piece is radially extended with a position limiting sheet disposed in the rail slot and in contact with the start blocking edge or the stop blocking edge for limiting and stopping rotations; when the rotating member is rotated relative to the positioning member, the position limiting sheet is abutted against the stop blocking edge or the start blocking edge, and the electronic device is locked or unlocked with respect to whether the block piece and the supporting platform jointly clamping the electronic device.

According to one embodiment of the present invention, the supporting platform has a positioning recess allowing the electronic device to be disposed, a guiding inclined surface allowing the positioning recess to be downwardly displaced and used for guiding is formed on the shaft column and arranged at an opposite end relative to the block piece, thereby allowing the positioning recess to be engaged with the shaft column.

According to one embodiment of the present invention, the fastening structure includes a sleeve block disposed at a bottom end of the base and sleeved in a plate hole of the plate member, and a fastening latch hook axially extended from a bottom end of the sleeve block and formed in an arrow-like shape; a pair of elastic hook sheets are outwardly extended from the fastening latch hook, free ends of the pair of elastic hook sheets are oppositely disposed with a plurality of teeth steps arranged in a multilayer stepped manner, so that the positioning member is able to be buckled with the plate member having different thicknesses or received in the plate hole having different diameters.

According to one embodiment of the present invention, an auxiliary fastening rib capable of increasing a connecting strength with the plate hole is axially protruded from at least one outer surface of the fastening latch hook.

According to one embodiment of the present invention, a fastening convex part is longitudinally protruded from an outer surface of the fastening latch hook, so that the fastening latch hook and the fastening convex part are able to be inserted in the plate hole formed in a T-like shape.

According to one embodiment of the present invention, an outer surface of the fastening latch hook and/or an outer surface defined at an opposite end of the fastening latch hook is axially protruded with an auxiliary fastening rib capable of increasing a connecting strength with the plate hole.

According to one embodiment of the present invention, a pivotal connecting structure is axially disposed on the positioning member and the rotating member, and adjacent surfaces of the pivotal connecting structure are oppositely disposed with a positioning mechanism, so that the rotating member is provided with a positioning function relative to the positioning member.

According to one embodiment of the present invention, the pivotal connecting structure includes a core shaft axially protruded from a top surface of the connecting ring, and a shaft hole axially disposed on a bottom surface of the shaft column and allowing the core shaft to be received; the positioning mechanism includes two positioning slots on an inner circumference of the shaft hole and corresponding to locations of the start blocking edge and the stop blocking edge; and at least one positioning tenon protruded on an outer circumference of the core shaft and corresponding to locations of the pair of positioning slots; wherein the pair of positioning slots release from the at least one positioning tenon, which has been mutually buckled with the pair of positioning slots, during a rotating process, and when the position limiting sheet is in contact with the stop blocking edge, the at least one positioning tenon and the pair of positioning slots form a position exchanging and latching status.

According to one embodiment of the present invention, a holding sheet allowing a user to hold and rotate is radially protruded on a top surface of the shaft column and/or a top surface of the block piece, when the holding sheet is held and rotated, the block piece, the supporting platform, the buckle hooks and the position limiting sheet are able to be synchronously rotated.

According to one embodiment of the present invention, a bottom surface of the holding sheet is connected to the top surface of the shaft column and/or the top surface of the block piece through a connecting sheet.

According to one embodiment of the present invention, an insertion slot allowing a tool to be inserted is radially formed on a top surface of the shaft column and/or a top surface of the block piece.

To make it easier for our examiner to understand the objective of the invention, its structure, innovative features, and performance, we use preferred embodiments together with the accompanying drawings for the detailed description of the invention.

DETAILED DESCRIPTION OF THE PREFERRED EMBODIMENTS

Figure 1:
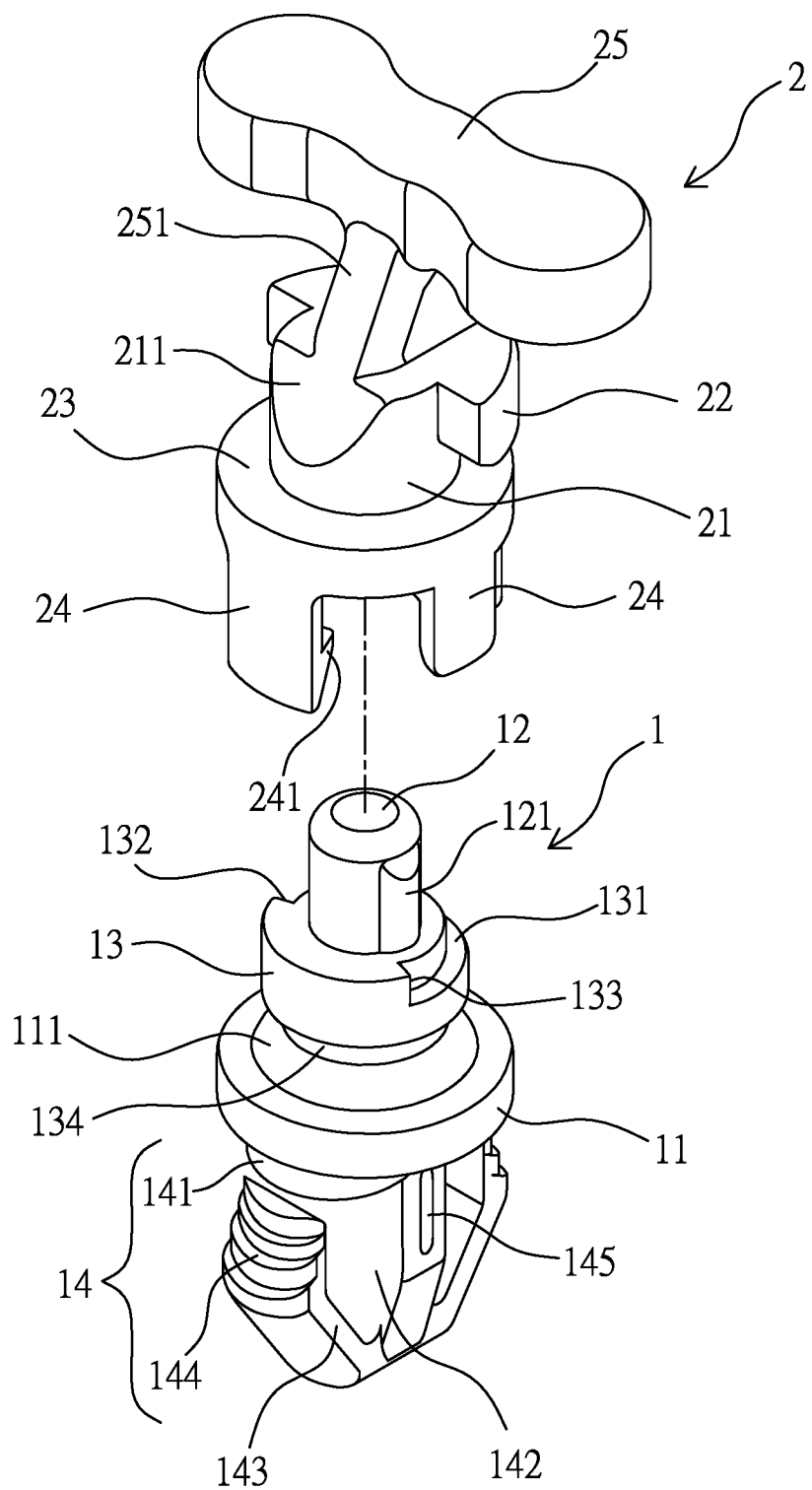
FIG. 1 is a perspective exploded view illustrating the fastener according to a first embodiment of the present invention.
Figure 2:
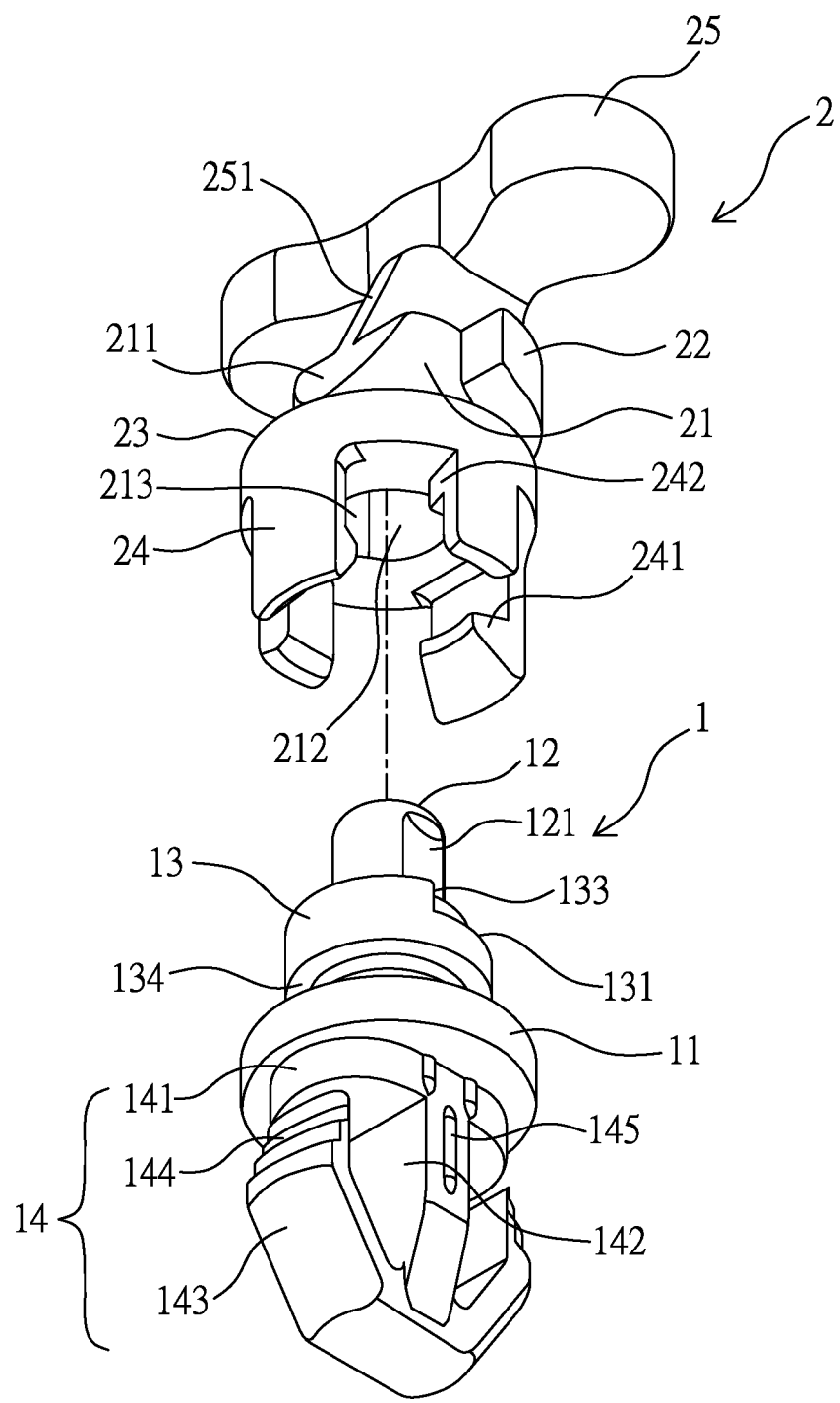
FIG. 2 is another perspective exploded view illustrating the fastener according to the first embodiment of the present invention.

Please refer to FIG. 1 and FIG. 2, a fastener for use in electronic device, for example a M.2 solid-state drive, a Wi-Fi wireless network card, a 3G network card or an electric circuit board, is disclosed according to a first embodiment of the present invention. The fastener is a solid member formed through an insulation material, for example a plastic material, being processed with an injection molding means, and the fastener includes a positioning member 1 and a rotating member 2.

Figure 12:
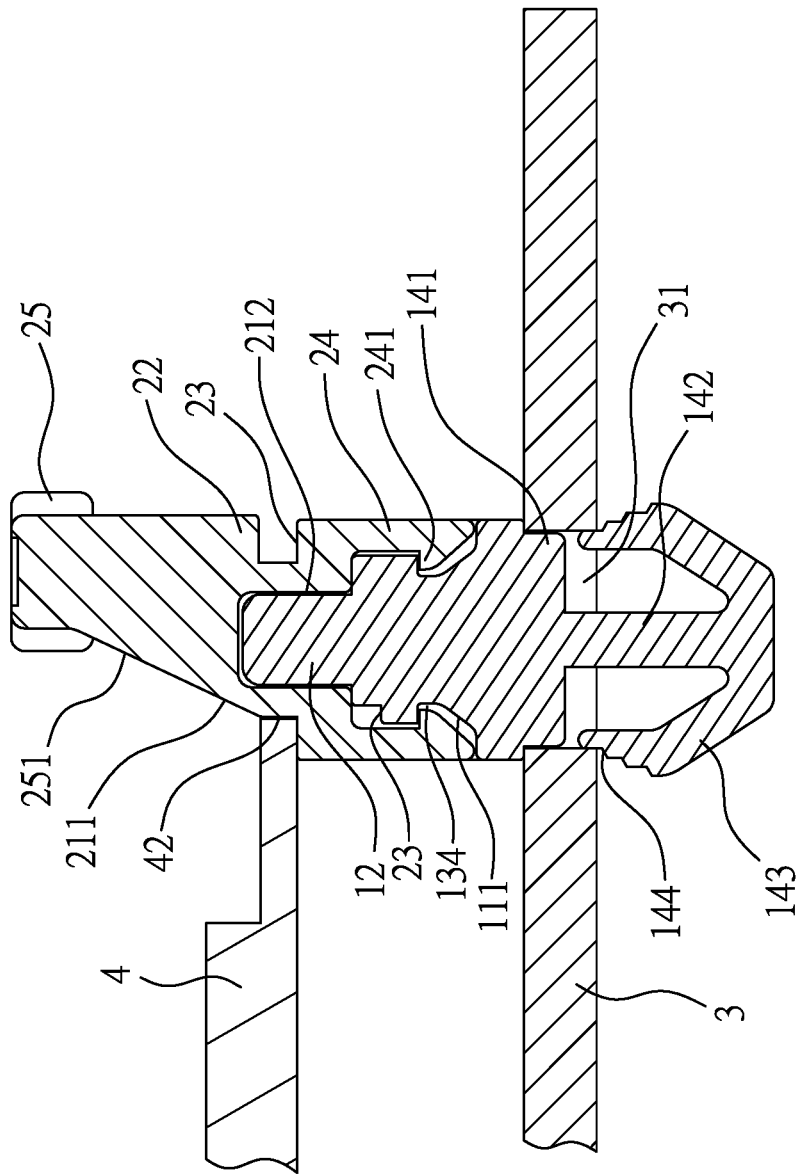
FIG. 12 is a cross sectional view of FIG. 10 taken along a D-D line.
Figure 13:
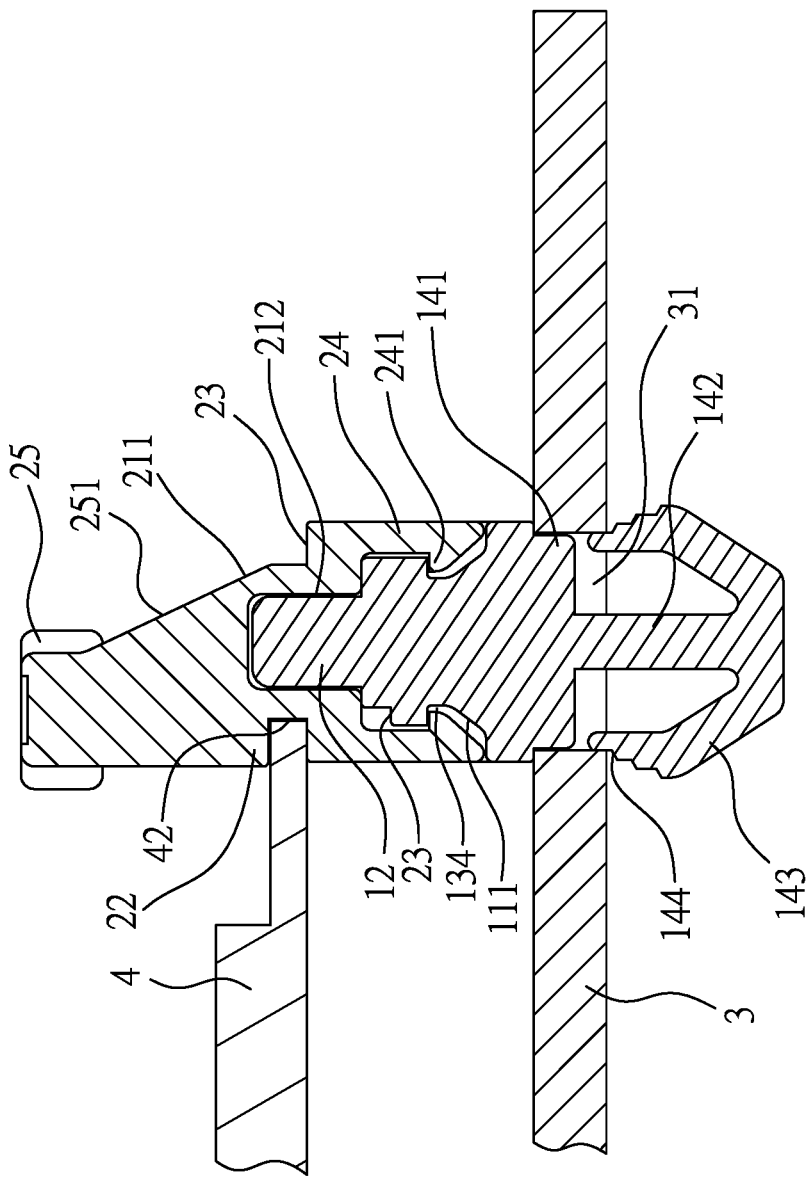
FIG. 13 is a cross sectional view of FIG. 11 taken along an E-E line.

The positioning member 1 has a base 11 formed with a geometric shape, for example a circular shape, and a connecting ring 13 is disposed above the base 11 and spaced with an interval relative to the base 11, an arc-shaped rail slot 131 is disposed on a top surface of the connecting ring 13, two ends of the rail slot 131 are respectively formed with a start blocking edge 132 and a stop blocking edge 133, and a buckle slot 134 is formed between the base 11 and the connecting ring 13; and a conical unit 111 (as shown in FIG. 12 and FIG. 13) is disposed between the base 11 and the connecting ring 13 for a purpose of connecting.

Figure 3:
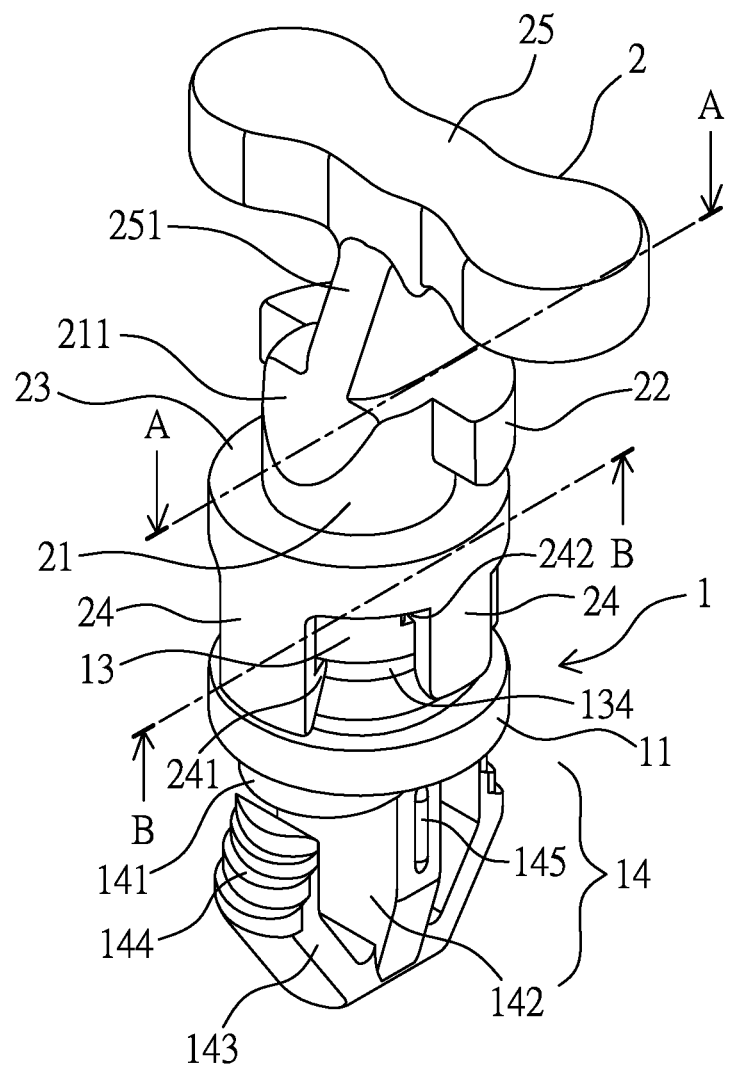
FIG. 3 is a perspective view illustrating the assembly of the fastener, wherein the fastener being in an unlocked status, according to the first embodiment of the present invention.
Figure 8:
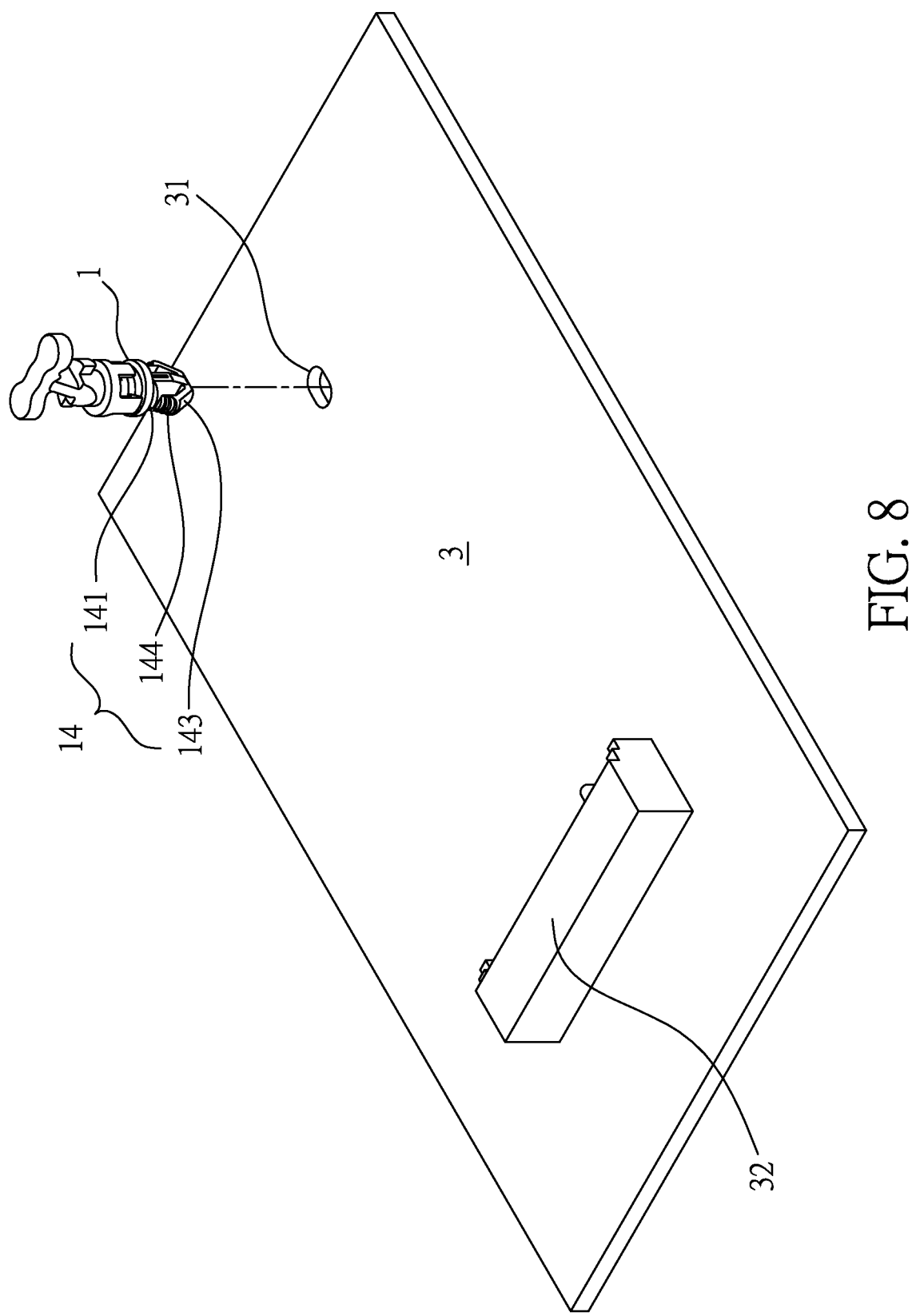
FIG. 8 to FIG. 11 are schematic view illustrating an assembling process of the fastener and an electronic device and a plate member according to the first embodiment of the present invention.
Figure 9:
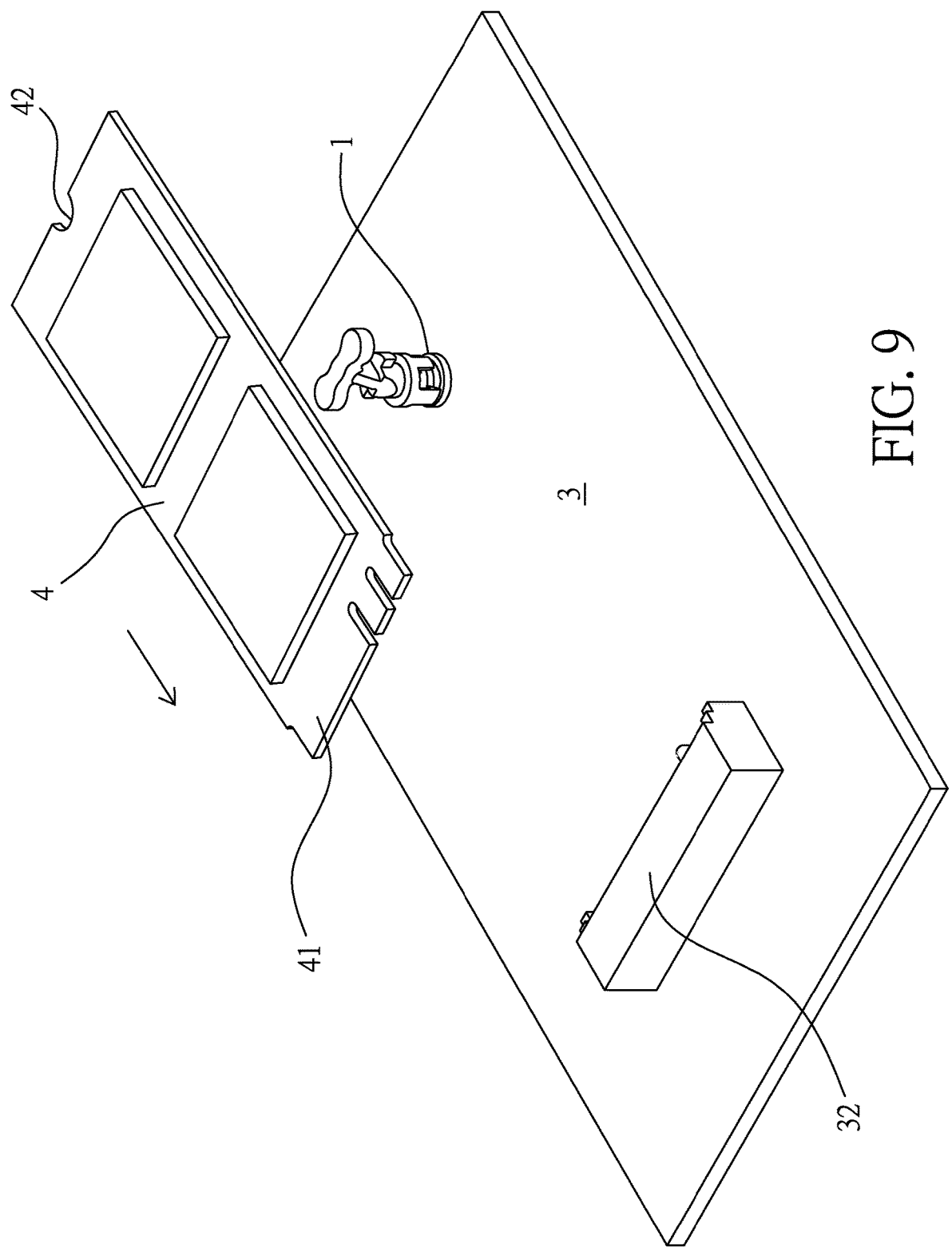

For enabling the positioning member 1 to be fastened on a plate member 3 (as shown in FIG. 8 and FIG. 9), a fastening structure 14 capable of being fastened on the plate member 3 is further disposed on a bottom surface of the base 11; please refer from FIG. 1 to FIG. 3, the fastening structure 14 includes a sleeve block 141 disposed at a bottom end of the base 11 and sleeved in a plate hole 31, and a fastening latch hook 142 axially extended from a bottom end of the sleeve block 141 and formed in an arrow-like shape. A pair of elastic hook sheets 143 are outwardly extended from the fastening latch hook 142, free ends of the pair of elastic hook sheets 143 are oppositely disposed with a plurality of teeth steps 144 arranged in a multilayer stepped manner, so that the positioning member 1 can be buckled with the plate member 3 having different thicknesses or received in the plate hole 31 having different diameters, thereby expending an application range.

Moreover, an auxiliary fastening rib 145 capable of increasing a connecting strength with the plate hole 31 is axially protruded from at least one outer surface of the fastening latch hook 142. In other words, the auxiliary fastening rib 145 is able to be corresponding to a tolerance of the plate hole 31, and an elastic deformation of the auxiliary fastening rib 145 itself made of a plastic material can be utilized to increase the connecting strength with the plate hole 31, thereby enhancing a fastening function.

The rotating member 2 has a shaft column 21 arranged in an axial direction of the rotating member 2, and a block piece 22 is radially formed on a top end of the shaft column 21; please refer from FIG. 1 to FIG. 3, the block piece 22 is formed as a half-moon sheet unit. An annular supporting platform 23 is radially formed at a bottom end of the shaft column 21, so that a gap is formed between the block piece 22 and the supporting platform 23. Moreover, a guiding inclined surface 211 is formed on the shaft column 21 and arranged at an opposite end relative to the block piece 22.

Moreover, at least three wing pieces 24 are axially and downwardly extended from a circumference of the supporting platform 23, wherein at least two of the wing pieces 24 respectively have a buckle hook 241 buckled with the buckle slot 134, and the other wing piece 24 is radially extended with position limiting sheet 242 disposed in the rail slot 131, so that the position limiting sheet 242 is able to be in contact with the start blocking edge 132 or the stop blocking edge 133 for limiting and stopping rotations.

Moreover, a pivotal connecting structure is axially disposed on the positioning member 1 and the rotating member 2, and adjacent surfaces of the pivotal connecting structure are oppositely disposed with a positioning mechanism, so that the rotating member 2 is provided with a positioning function relative to the positioning member 1. Wherein, the pivotal connecting structure includes a core shaft 12 axially protruded from a top surface of the connecting ring 13, and a shaft hole 212 disposed on a bottom surface of the shaft column 21 and allowing the core shaft 12 to be received. A positioning mechanism is respectively and oppositely disposed on an inner circumference of the shaft hole 212 and an outer circumference of the core shaft 12; as shown in FIG. 2, the positioning mechanism includes a pair of positioning slots 213 formed on the inner circumference of the shaft hole 212 and corresponding to locations of the start blocking edge 132 and the stop blocking edge 133, respectively; and at least one positioning tenon 121 protruded on the outer circumference of the core shaft 12 and corresponding to locations of the pair of positioning slots 213. Please refer to FIG. 4, the outer circumference of the core shaft 12 is protruded with a pair of positioning tenons 121 corresponding to the locations of the pair of positioning slots 213, thereby forming a buckling status.

Furthermore, a holding sheet 25 allowing a user to hold is radially protruded on a top surface of the shaft column 21 and/or a top surface of the block piece 22, so that when the holding sheet 25 is held and rotated, the block piece 22, the supporting platform 23, the buckle hooks 241 and the position limiting sheet 242 can be synchronously rotated. Wherein, a bottom surface of the holding sheet 25 is connected to the top surface of the shaft column 21 and/or the top surface of the block piece 22 through a connecting sheet 251, thereby allowing the operation to be easier.

As shown in FIG. 3, when the rotating member 2 and the positioning member 1 are assembled, the wing pieces 24 of the rotating member 2 are disposed and connected to the connecting ring 13 of the positioning member 1, and each of the buckle hooks 241 of the at least two wing pieces 24 are buckled in the buckle slot 134, so that the rotating member 2 can be preventing from being axially released from the positioning member 1, and the position limiting sheet 242 of the other wing piece 24 is protruded into the rail slot 131, the core shaft 12 is inserted in the shaft holt 212, and the pair of positioning tenons 121 are buckled in the pair of positioning slots 213.

Figure 4:
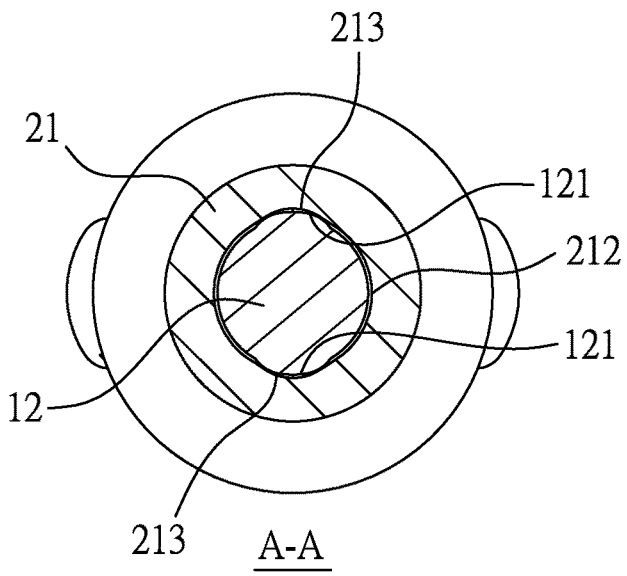
FIG. 4 is a cross sectional view of FIG. 3 taken along an A-A line.

As shown in FIG. 4, the core shaft 12 is inserted in the shaft hole 212 and the pair of positioning tenons 121 are buckled in the pair of positioning slots 213, thereby establishing a positioning relation.

Figure 5:
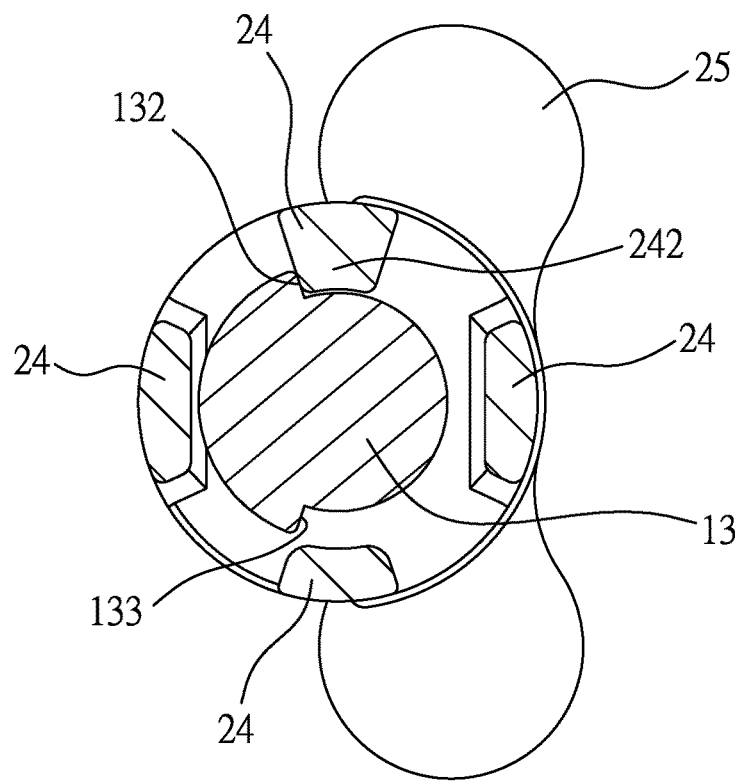
FIG. 5 is a cross sectional view of FIG. 3 taken along a B-B line.

Please refer to FIG. 5, the position limiting sheet 242 is protruded into the rail slot 131 and abutted against the start blocking edge 132, and the position limiting sheet 242 is in contact with the start blocking edge 132 or the stop blocking edge 133 for limiting and stopping rotations.

Figure 6:
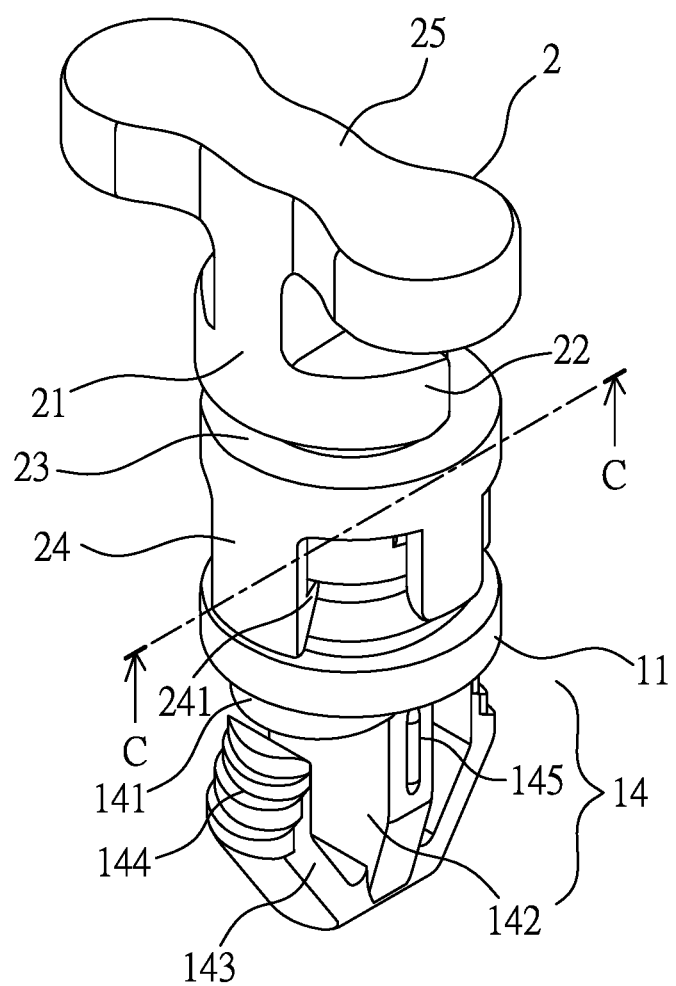
FIG. 6 is a perspective view illustrating an operation of the fastener, wherein the fastener being in a locked status, according to the first embodiment of the present invention.
Figure 7:
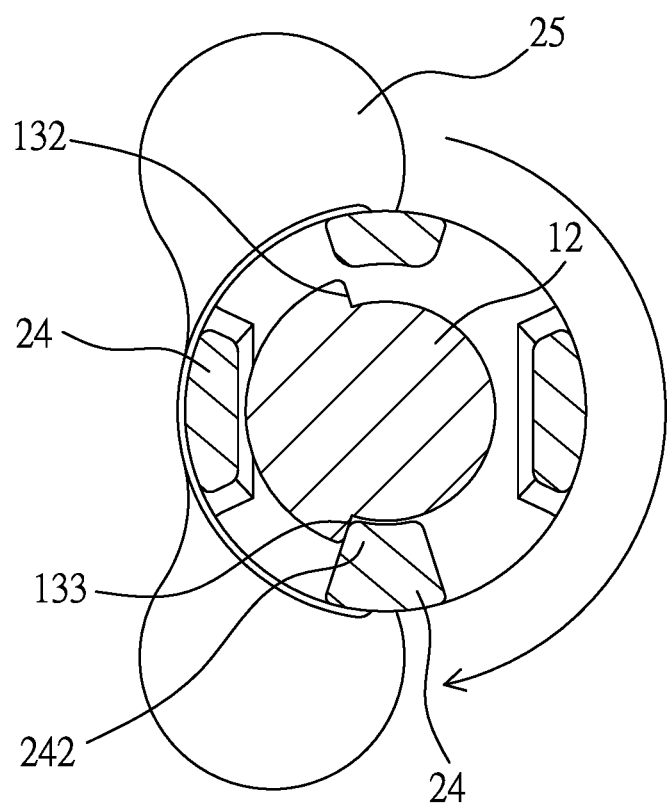
FIG. 7 is a cross sectional view of FIG. 6 taken along a C-C line.
Figure 11:
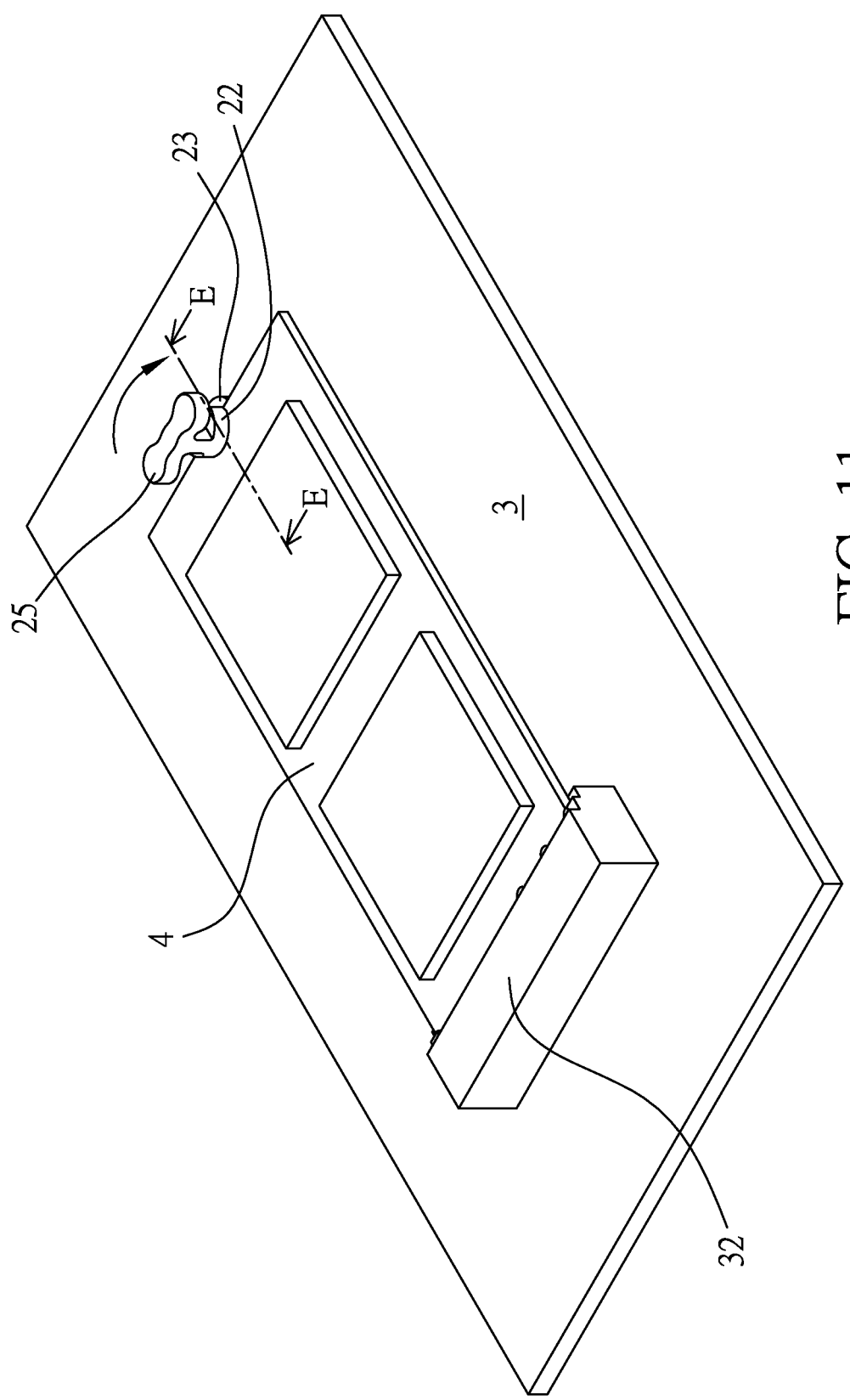

Please refer to FIG. 6, when a locked status is desired to be formed to an electronic device 4, for example a M.2 solid-state drive, a Wi-Fi wireless network card, a 3G network card or an electric circuit board, the holding sheet 25 is held and rotated by the user, so that the shaft hole 212 of the rotating member 2 is able to rotate with the core shaft 12 of the positioning member 1 being served as a shaft core, the block piece 22, the supporting platform 23, the buckle hooks 241 and the position limiting sheet 242 can be synchronously rotated, so that the position limiting sheet 242 is able to move along the rail slot 131 until being in contact with the stop blocking edge 133 (as shown in FIG. 7); the pair of positioning slots 213 would release from the at least one positioning tenon 121, which has been mutually buckled with the pair of positioning slots 213, during the rotating process, and when the position limiting sheet 242 is in contact with the stop blocking edge 133, the at least one positioning tenon 121 and the pair of positioning slots 213 form a position exchanging and latching status, so that the rotating member 2 is provided with the positioning function to the positioning member 1, and an operation with obvious staging feelings can be provided; and the block piece 22 is rotated to the opposite direction, so that the electronic device 4 is formed in a locked status (shown from FIG. 9 and FIG. 11).

Accordingly, based on what has been disclosed above, when the fastener allows the rotating member 2 to be rotated relative to the positioning member 1, the position limiting sheet 242 is abutted against the stop blocking edge 133 or the start blocking edge 132, and the electronic device 4 can be locked or unlocked with respect to whether the block piece 22 and the supporting platform 23 jointly clamping the electronic device 4.

When being in the locked status, the block piece 22 and the supporting platform 23 jointly clamp a positioning recess 42 of the electronic device 4, so that the electronic device 4 is provided with effects of being stably positioned, and a shaking situation can be avoided.

Please refer from FIG. 8 to FIG. 13, which disclose an assembling process of the fastener of the first embodiment, the plate member 3 and the electronic device 4, wherein the plate member 3 is an electric circuit board in an actual practice, and the electronic device 4 is selected from a grouping consisted of a M.2 solid-state drive, a Wi-Fi wireless network card, a 3G network card and an electric circuit board in the actual practice. When being assembled by an operator in an assembly factory, the sleeve block 141, the fastening latch hook 142 and the pair of elastic hook sheets 143 of the fastening structure 14 of the positioning member 1 are aimed at the elongated plate hole 31 (as shown in FIG. 8) of the plate member 3 so as to be inserted therein, so that the sleeve block 141 is received in the plate hole 31, a pair of the plurality of teeth steps 144 of the pair of elastic hook sheets 143 are buckled with a pair of long side edges of the plate hole 31, and the positioning member 1 is able to be firmly connected and fastened on the plate member 3 via the fastening structure 14 (as shown in FIG. 9).

Figure 10:
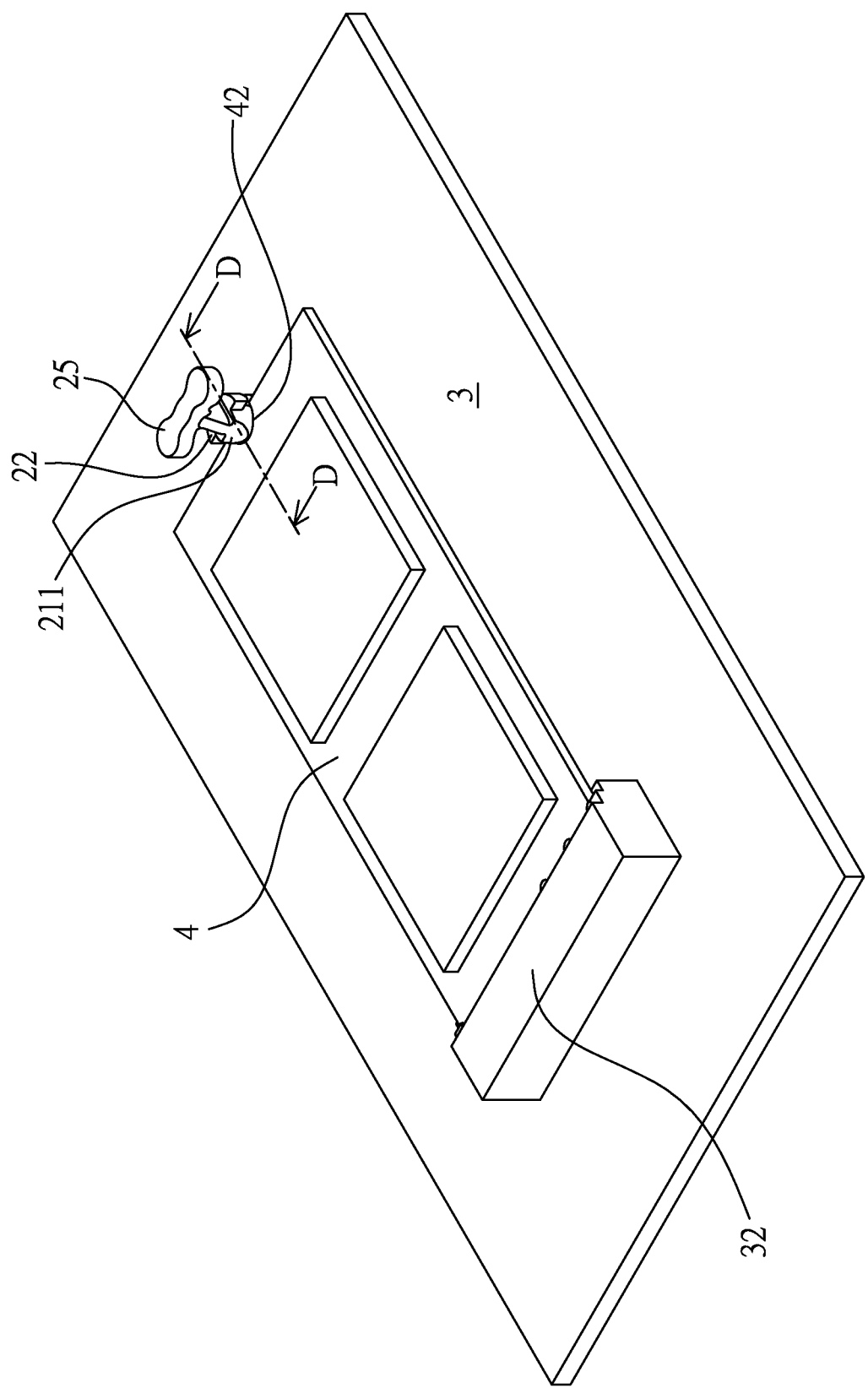

A contact part 41 at one end of the electronic device 4 is inserted and connected to a connector 32 disposed on the plate member 3; the positioning recess 42 at another end thereof is downwardly displaced along the guiding inclined surface 211 so as to be disposed in the supporting platform 23 (as shown in FIG. 10 and FIG. 12), thereby allowing the positioning recess 42 to be engaged with the shaft column 21. At this moment, the holding sheet 25 is clockwise rotated by the operator, thus the block piece 22, the supporting platform 23, the buckle hooks 241 and the position limiting sheet 242 can also be synchronously rotated, and the position limiting sheet 242 is moved along the rail slot 131 until being in contact with the stop blocking edge 133, the pair of positioning slots 213 would release from the at least one positioning tenon 121, which has been mutually buckled with the pair of positioning slots 213, during the rotating process, and when the position limiting sheet 242 is in contact with the stop blocking edge 133, the at least one positioning tenon 121 and the pair of positioning slots 213 forms a position exchanging and latching status, and the block piece 22 is rotated to the opposite direction, so that the another end of the electronic device 4 is jointly clamped by the block piece 22 and the supporting platform 23 for allowing the electronic device 4 to be formed in the locked status (as shown in FIG. 11 and FIG. 13), the positioning member 1 is fastened on the plate member 3, and the electronic device 4 is provided with a stably fastening effect, a shaking situation is avoided and the electrical connection of the electronic device 4 and the connector 32 can be ensured.

Figure 14:
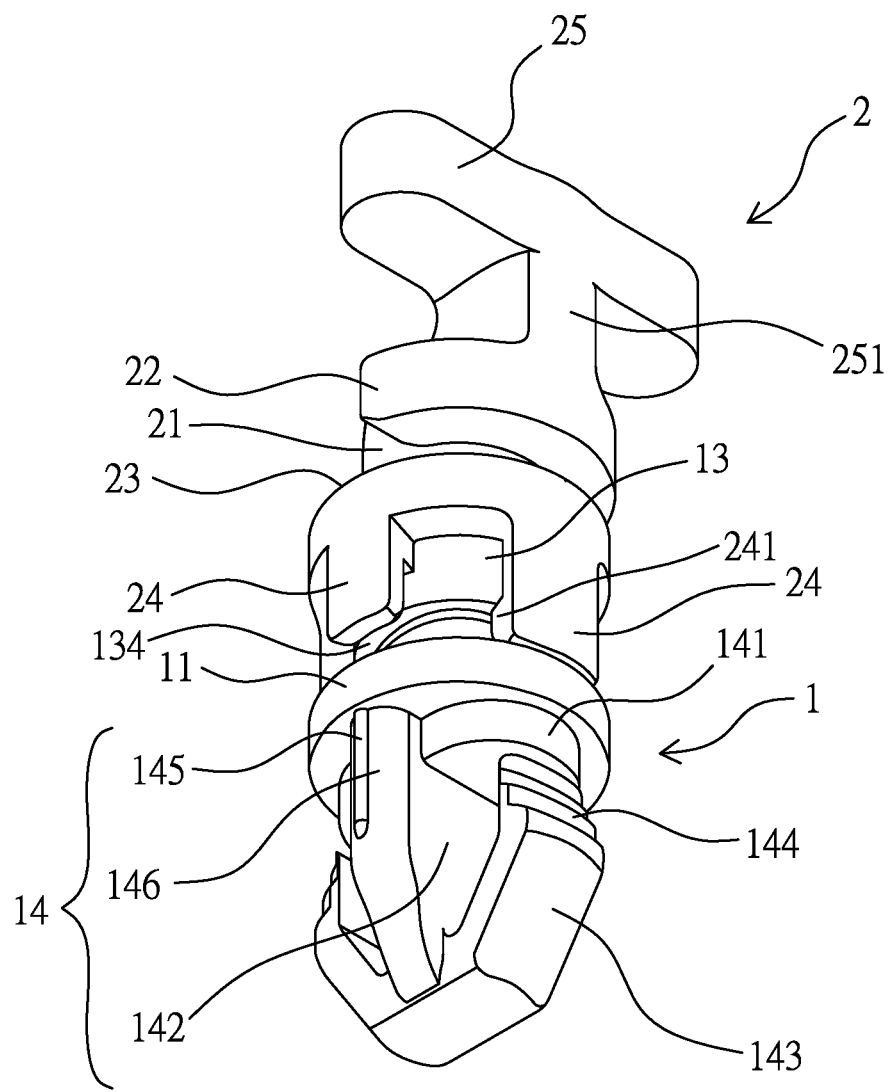
FIG. 14 is a perspective view illustrating the fastener according to a second embodiment of the present invention.

Please refer from FIG. 14 and FIG. 15, which disclose a second embodiment illustrating the fastener provided by the present invention, the same codes (marks) shared by the second embodiment and the first embodiment are defined as the same components, because there are many components shared by the second embodiment and the first embodiment, only the differences between the second embodiment and the first embodiment are illustrated as follows.

Figure 15:
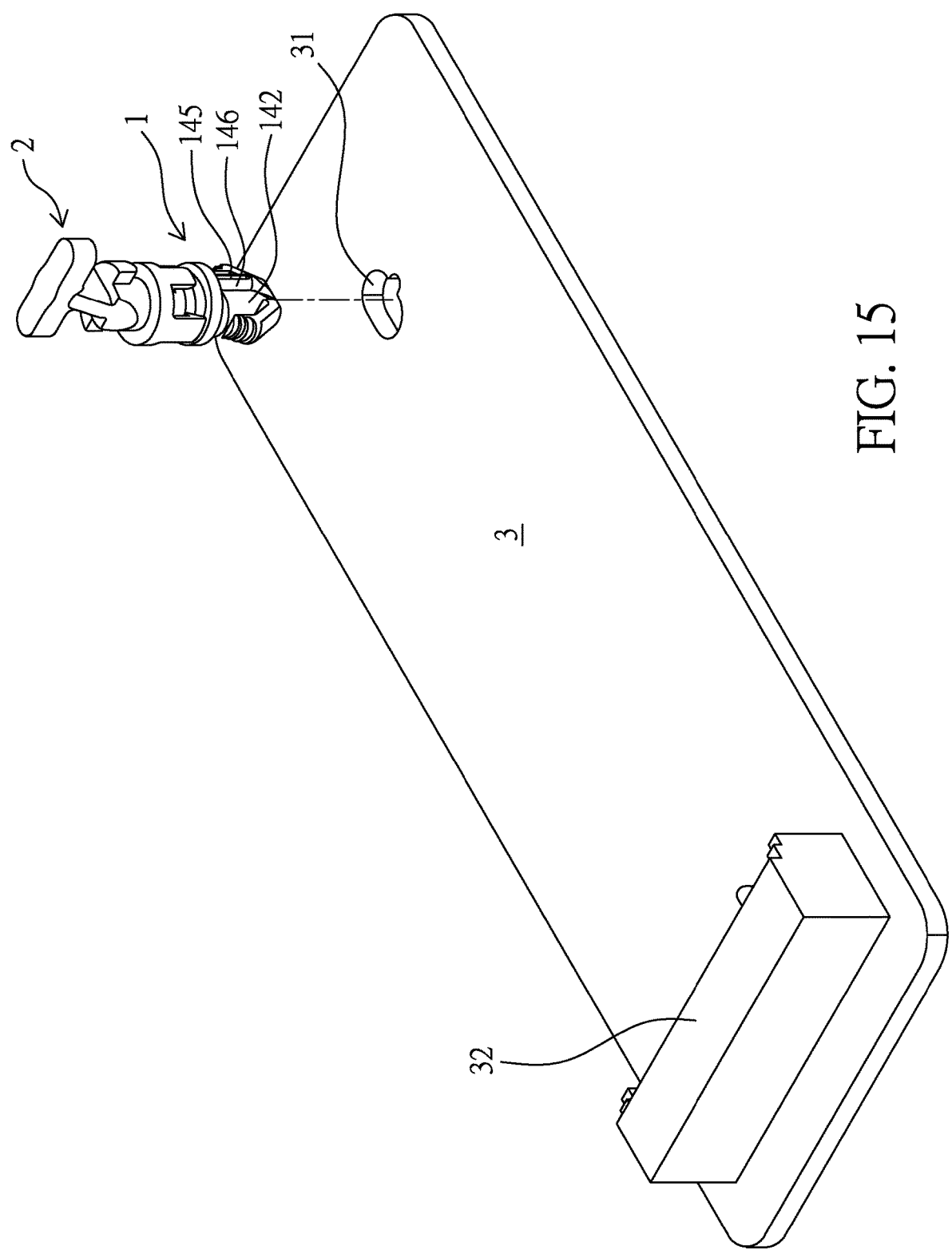
FIG. 15 is a perspective exploded view illustrating the fastener and the plate member according to the second embodiment of the present invention.

According to the second embodiment, a fastening convex part 146 is axially protruded from an outer surface of the fastening latch hook 142, the fastening latch hook 142 and the fastening convex part 146 are able to be inserted in the plate hole 31 formed in a T-like shape (as shown in FIG. 15), and a foolproof (anti-misplugging) effect can be provided by the fastening convex part 146.

As such, according to the second embodiment, an outer surface of the fastening convex part 146 and/or an outer surface of the fastening latch hook 142 at the opposite side can be axially protruded with an auxiliary fastening rib 145 capable of increasing the connecting strength with the plate hole 31, the auxiliary fastening rib 145 is able to be corresponding to a tolerance of the plate hole 31, and an elastic deformation of the auxiliary fastening rib 145 itself made of a plastic material can be utilized to increase the connecting strength with the plate hole 31, thereby enhancing a fastening function.

Figure 16:
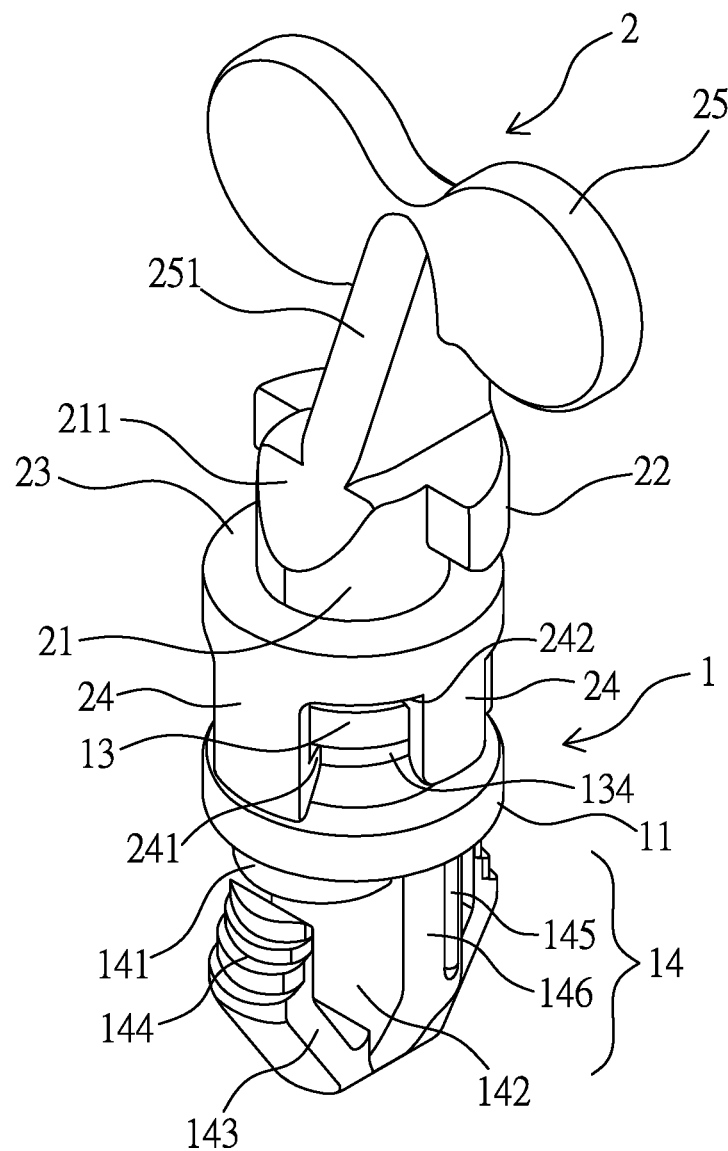
FIG. 16 is a perspective view illustrating the fastener according to a third embodiment of the present invention.

Please refer to FIG. 16, which disclose a third embodiment illustrating the fastener provided by the present invention, the same codes (marks) shared by the third embodiment and the first embodiment are defined as the same components, because there are many components shared by the third embodiment and the first embodiment, only the differences between the third embodiment and the first embodiment will be illustrated as follows.

A difference between the holding sheet 25 of the third embodiment and the holding sheet 25 of the first embodiment is the appearance thereof; according to the third embodiment, a bottom surface of the holding sheet 25 is connected to the top surface of the shaft column 21 and/or the top surface of the block piece 22 via a connecting sheet 251. As such, the claim of the third embodiment is the same as that of the first embodiment.

Figure 17:
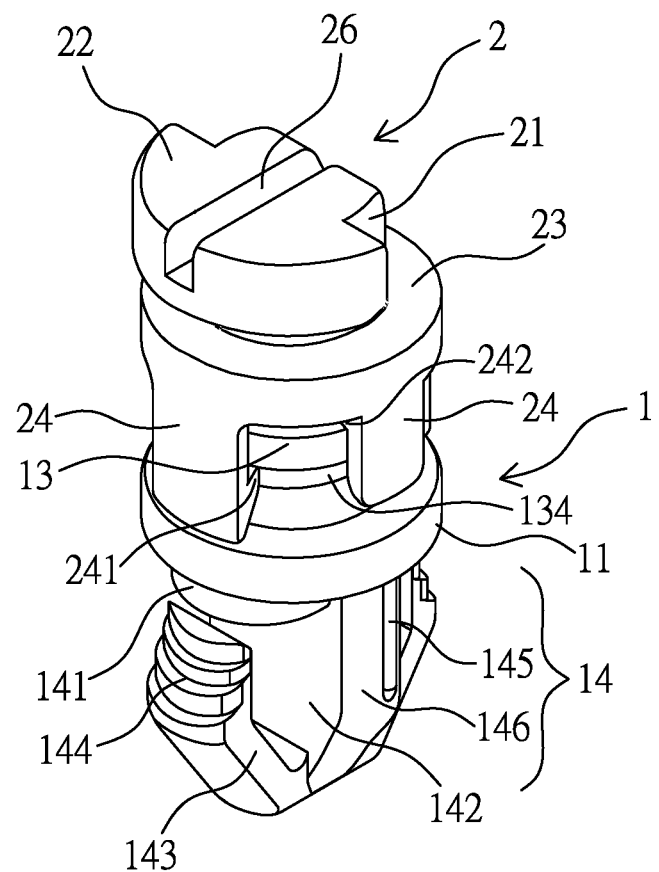
FIG. 17 is a perspective view illustrating the fastener according to a fourth embodiment of the present invention.

Please refer to FIG. 17, which disclose a fourth embodiment illustrating the fastener provided by the present invention, the same codes (marks) shared by the fourth embodiment and the first embodiment are defined as the same components, because there are many components shared by the fourth embodiment and the first embodiment, only the differences between the fourth embodiment and the first embodiment will be illustrated as follows.

According to the fourth embodiment, the holding sheet 25 and the connecting sheet 251 disclosed in the first embodiment are not provided, an insertion slot 26 is radially formed on the top surface of the shaft column 21 and/or the top surface of the block piece 22, the insertion slot 26 allows a tool, for example a flat inserting end of a screwdriver, to be inserted for driving the rotating member 2 to rotate, so that the electronic device can be locked or unlocked.

Based on what has been disclosed above, advantages achieved by the present invention are as follows. With the rotating member being rotated on the positioning member, the block piece and the supporting platform can also be synchronously rotated, and the rotating angle limitation can be defined through the position limiting sheet being in the start blocking edge and the stop blocking edge of the rail slot, thereby forming the locked or the unlocked status to the electronic device. Moreover, the pivotal connecting structure is disposed between the positioning member and the rotating member for the purpose of connecting, for example the positioning mechanism being oppositely disposed at adjacent surfaces of the shaft hole and the core shaft, so that the rotating member is provided with the positioning function to the positioning member, and an operation with obvious staging feelings can also be provided. Accordingly, the present invention is novel and more practical in use comparing to prior arts.

While the invention has been described by way of example and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

In summation of the above description, the present invention herein enhances the performance over the conventional structure and further complies with the patent application requirements and is submitted to the Patent and Trademark Office for review and granting of the commensurate patent rights.

What is claimed is:

1. A fastener for use in electronic device, including:
   a positioning member, having a base, wherein a connecting ring is disposed above said base and spaced with an interval relative to said base, a rail slot is disposed on a top surface of said connecting ring, two ends of said rail slot are respectively formed with a start blocking edge and a stop blocking edge, and a buckle slot is formed between said base and said connecting ring; and
   a fastening structure capable of being fastened on a plate member is disposed on a bottom surface of said base; and
   a rotating member, having a shaft column arranged in an axial direction of said rotating member, wherein a block piece is radially formed on a top end of said shaft column, an annular supporting platform allowing an electronic device to be disposed is radially protruded at a bottom end of said shaft column, so that a gap is formed between said block piece and said annular supporting platform, at least three wing pieces are axially and downwardly extended from a circumference of said supporting platform, at least two of said at least three wing pieces respectively have a buckle hook buckled with said buckle slot, and one said wing piece is radially extended with a position limiting sheet disposed in said rail slot and in contact with said start blocking edge or said stop blocking edge for limiting and stopping rotations;

when said rotating member is rotated relative to said positioning member, said position limiting sheet is abutted against said stop blocking edge or said start blocking edge, and said electronic device is locked or unlocked with respect to whether said block piece and said supporting platform jointly clamping said electronic device.

2. The fastener for use in electronic device as claimed in claim 1, wherein said supporting platform has a positioning recess allowing said electronic device to be disposed, a guiding inclined surface allowing said positioning recess to be downwardly displaced and used for guiding is formed on said shaft column and arranged at an opposite end relative to said block piece, thereby allowing said positioning recess to be engaged with said shaft column.

3. The fastener for use in electronic device as claimed in claim 1, wherein said fastening structure includes a sleeve block disposed at a bottom end of said base and sleeved in a plate hole of said plate member, and a fastening latch hook axially extended from a bottom end of said sleeve block and formed in an arrow-like shape; a pair of elastic hook sheets are outwardly extended from said fastening latch hook, free ends of said pair of elastic hook sheets are oppositely disposed with a plurality of teeth steps arranged in a multilayer stepped manner, so that said positioning member is able to be buckled with said plate member having different thicknesses or received in said plate hole having different diameters.

4. The fastener for use in electronic device as claimed in claim 3, wherein an auxiliary fastening rib capable of increasing a connecting strength with said plate hole is axially protruded from at least one outer surface of said fastening latch hook.

5. The fastener for use in electronic device as claimed in claim 3, wherein a fastening convex part is longitudinally protruded from an outer surface of said fastening latch hook, so that said fastening latch hook and said fastening convex part are able to be inserted in said plate hole formed in a T-like shape.

6. The fastener for use in electronic device as claimed in claim 5, wherein an outer surface of said fastening latch hook and/or an outer surface defined at an opposite end of said fastening latch hook is axially protruded with an auxiliary fastening rib capable of increasing a connecting strength with said plate hole.

7. The fastener for use in electronic device as claimed in claim 1, wherein a pivotal connecting structure is axially disposed on said positioning member and said rotating member, and adjacent surfaces of said pivotal connecting structure are oppositely disposed with a positioning mechanism, so that said rotating member is provided with a positioning function relative to said positioning member.

8. The fastener for use in electronic device as claimed in claim 7, wherein said pivotal connecting structure includes a core shaft axially protruded from a top surface of said connecting ring, and a shaft hole axially disposed on a bottom surface of said shaft column and allowing said core shaft to be received; said positioning mechanism includes two positioning slots on an inner circumference of said shaft hole and corresponding to locations of said start blocking edge and said stop blocking edge; and at least one positioning tenon protruded on an outer circumference of said core shaft and corresponding to locations of said pair of positioning slots; wherein said pair of positioning slots release from said at least one positioning tenon, which has been mutually buckled with said pair of positioning slots, during a rotating process, and when said position limiting sheet is in contact with said stop blocking edge, said at least one positioning tenon and said pair of positioning slots form a position exchanging and latching status.

9. The fastener for use in electronic device as claimed in claim 1, wherein a holding sheet allowing a user to hold and rotate is radially protruded on a top surface of said shaft column and/or a top surface of said block piece, when said holding sheet is held and rotated, said block piece, said supporting platform, said buckle hooks, and said position limiting sheet are able to be synchronously rotated.

10. The fastener for use in electronic device as claimed in claim 9, wherein a bottom surface of said holding sheet is connected to said top surface of said shaft column and/or said top surface of said block piece through a connecting sheet.

11. The fastener for use in electronic device as claimed in claim 1, wherein an insertion slot allowing a tool to be inserted is radially formed on a top surface of said shaft column and/or a top surface of said block piece.

* * * * *